United States Patent [19]

Grossman et al.

[11] 3,739,232

[45] June 12, 1973

[54] INTERCONNECTED ELECTRICAL CIRCUIT BOARD ASSEMBLY AND METHOD OF FABRICATION

[75] Inventors: Norman J. Grossman, Malibu; Kermit K. W. Heid, Gardena; Richard D. Pittman, Thousand Oaks; Ralph E. MacDougall, Woodland Hills, all of Calif.

[73] Assignee: Northrop Corporation, Los Angeles, Calif.

[22] Filed: Apr. 10, 1972

[21] Appl. No.: 242,569

[52] U.S. Cl. ............. 317/101 CP, 29/574, 29/572, 317/101 CM

[51] Int. Cl. ............................................. H05k 1/04

[58] Field of Search ............... 317/101 A, 101 CM, 317/101 CP; 29/577, 574; 174/685

[56] References Cited

UNITED STATES PATENTS

| | | | |
|---|---|---|---|
| 3,457,639 | 7/1969 | Weller | 29/577 |
| 3,379,938 | 4/1968 | Bywaters | 317/101 A |
| 3,142,783 | 7/1964 | Warren | 317/101 CP |

*Primary Examiner*—David Smith, Jr.
*Attorney*—Edward A. Sokolski and W. M. Graham

[57] ABSTRACT

An electrical circuit board assembly is formed by first depositing a conductive material on a substrate which forms both a ground and a heat sink for components subsequently mounted thereon. A cavity pattern is then formed in a dielectric material placed over the conductive layer to form an alignment plate, the pattern in the plate being designed to receive various components which are placed therein. An etched circuit board which has apertures therein corresponding to the cavities in the alignment plate and having beam leads extending into these apertures and from the edges thereof, is placed over the alignment plate in alignment therewith, with the beam leads contacting corresponding terminals on the components mounted in the cavities. With the components resting on the conductive layer in the cavities but not attached thereto, and with the beam leads contacting but not attached to the component terminals, the unit is tested both electrically and mechanically and any faulty components replaced. After all testing and replacement of faulty components has been completed, the components are bonded in their aligned positions to the conductive layer on the substrate and the beam leads are bonded to associated terminals of the components.

7 Claims, 9 Drawing Figures

Patented June 12, 1973 3,739,232

2 Sheets-Sheet 1

INTERCONNECTED ELECTRICAL CIRCUIT BOARD ASSEMBLY AND METHOD OF FABRICATION

This invention relates to electrical circuit boards, and more particularly to an assembly for such boards involving the combination of etched circuit units with components such as integrated circuits and the like to form an integrally packaged assembly.

Various techniques have been developed for forming integral electrical assemblies by combining etched circuit boards with various components including integrated circuits and the like. Particularly where integrated circuits are utilized, it is possible to form assembled units of this type which include a large amount of circuitry in a relatively small package. Where dealing with miniature components, such as integrated circuits, the alignment and interconnection of the various leads can be somewhat laborious, involving close work under a magnifying glass. A particular problem is presented in certain prior art approaches involving the use of connection leads in the form of wires which must be connected at both ends to the elements to be interconnected. To overcome this difficulty, certain prior art techniques have been developed utilizing beam leads which extend from overlying etched circuit boards, these beam leads providing connections to various components to be connected to the etched circuit board. Even with this improved approach of the prior art, a problem is presented if on testing the unit after it is assembled it is found that certain of the components are defective. In view of the miniaturization, it is difficult to remove the defective components for replacement without damaging the leads or components so as to make rework impossible. Further, a problem is presented, especially where dealing with closely packed miniaturized units, in providing proper heat dissipation for the components.

This invention provides an improved electrical circuit board assembly and a technique for fabricating such assembly in which the aforementioned shortcomings of the prior art are effectively obviated. This end result is achieved in the present invention by providing means for accurately aligning the components with their associated circuit board leads so that the entire assembly can be tested prior to the making of permanent interconnections. Thus, defective components can be replaced without the need for detaching any components or leads which might cause damage to the unit. Further, in this invention a highly effective heat sink which can also be used as a ground is provided for all of the components to efficiently dissipate any heat which may be generated therein. Further, the technique of this invention, by virtue of the easy to use and accurate alignment aids provided, greatly facilitates the accurate assembly of components with associated circuit boards.

It is therefore an object of this invention to facilitate the fabrication of electrical circuit board assemblies.

It is a further object of this invention to enable the testing of assembled circuit board assemblies prior to permanent mounting and interconnection of the components thereof.

It is still another object of this invention to provide a circuit board assembly having improved means for dissipating heat from the components thereof and providing a ground for such components.

Other objects of this invention will become apparent as the description proceeds in connection with the accompanying drawings, of which:

Briefly described, the technique and end product of the invention are as follows: a conductive layer is first deposited on a dielectric substrate in a particular pattern for providing both a heat sink and ground for the various components in the assembly. Next, several layers of a photopolymeric material are laminated over the heat sink layer, and the laminated layers are then photo-etched to form a plurality of cavities for receiving the various components of the assembly. Alignment markers are provided in these layers for use in aligning components. The laminated layers thus form an alignment plate for precisely aligning the various components in position for receiving interconnecting leads subsequently to be placed thereover. The components are then placed in position in the cavities in the alignment plate. At this point they are tested both electrically and physically for any defects, and if no such defects are noted, they are bonded to the conductive heat sink layer. Next, an etched circuit board which has apertures therein corresponding to the cavities in the alignment plate, and having beam leads providing circuit interconnections which extend into the apertures, is placed over the alignment plate with the apertures therein precisely aligned with the cavities of the alignment plate and with the beam leads making electrical contact with associated terminals on the components. With the etched circuit board resting in position such that proper electrical contact is being made by the beam leads, but without bonding these leads, the unit is tested out for faults, components or leads being replaced as needed when such faults are found. Finally, the beam leads are permanently bonded to the component terminals and the etched circuit board bonded to the alignment plate to form an integral assembly.

Figure 1:
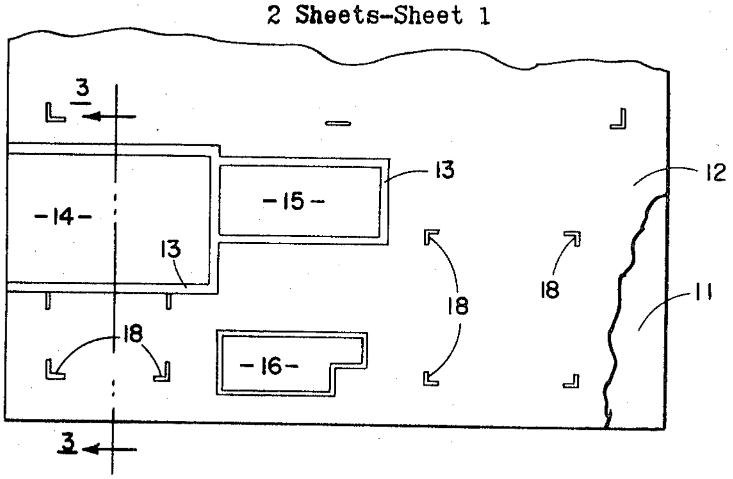
FIG. 1 is a top plan view illustrating the fabrication of the ground and heat sink layer of the invention.
Figure 3:
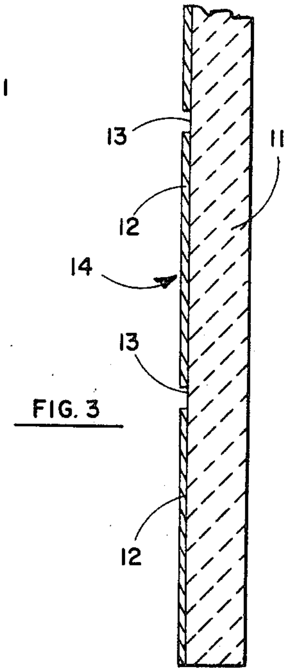
FIG. 3 is a cross sectional view taken along the plane indicated by 3—3 in FIG. 1.

Referring now to FIGS. 1 and 3, the first step in the fabrication of the assembly of the invention is illustrated. An electrically and thermally conductive layer 12 is deposited on substrate board 11 which is fabricated out of dielectric material. Conductive layer 12 may be deposited on the board by vacuum deposition or other techniques well known in the art. Exposed areas 13 are etched away from conductive layer 12 by photoetching to form insulated electrically conductive "lands" 14, 15 and 16, which can be used to provide separate grounds and thermal heat sinks for particular components. Also etched in the conductive layer are markers 18 for use in positionally aligning certain of the components.

Figure 2:
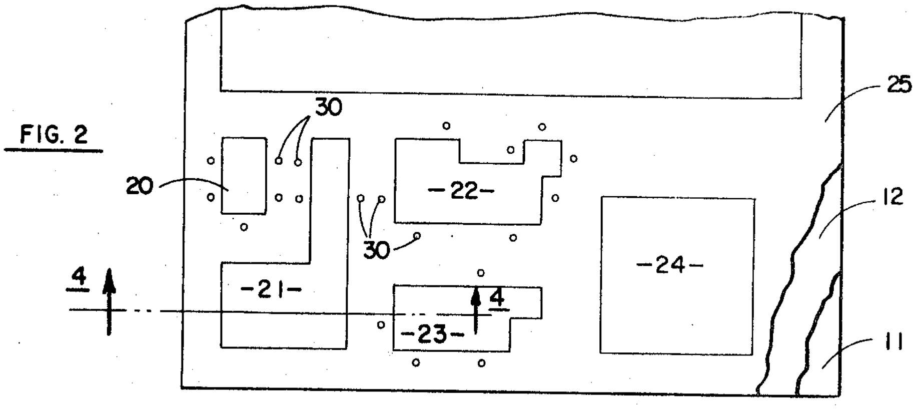
FIG. 2 is a top plan view illustrating the fabrication of the alignment plate portion of the assembly of the invention.
Figure 4:
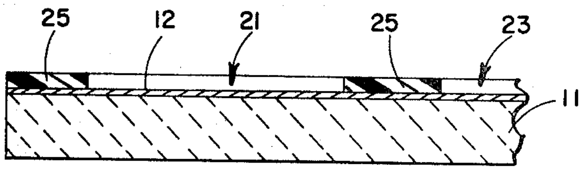
FIG. 4 is a cross sectional view taken along the plane indicated by 4—4 in FIG. 2.

Referring now to FIGS. 2 and 4, the next step in the assembly procedure is illustrated. In this step, several layers of photopolymeric material are laminated onto conductive surface 12 to a thickness such that the components which are later mounted on the conductive layer will extend approximately three-quarters of their thickness above the surface of the polymeric layers. The polymeric layers, which may be of a dielectric material such as Riston available from the DuPont Corporation, are photo-etched to form a plurality of cavities 20–24 for receiving the components later to be mounted therein. Also etched in the photopolymeric layers are alignment marker holes 30 for use in precisely aligning the components in the cavities. The polymeric layers thus form an alignment plate 25 for use in accurately positioning the various components as to be explained further on in the specification.

Figure 6:
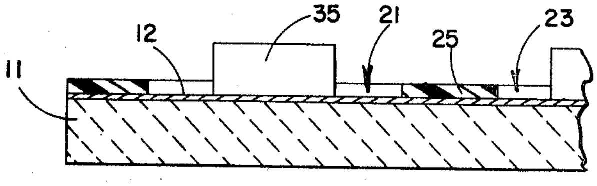
FIG. 6 is a cross sectional view taken along the plane indicated by 6—6 in FIG. 5.
Figure 9:
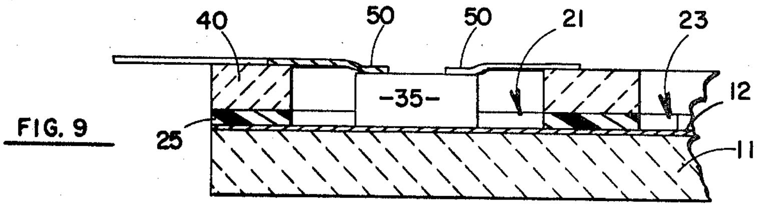
FIG. 9 is a cross sectional view taken along the plane indicated by 9—9 in FIG. 8.
Figure 5:
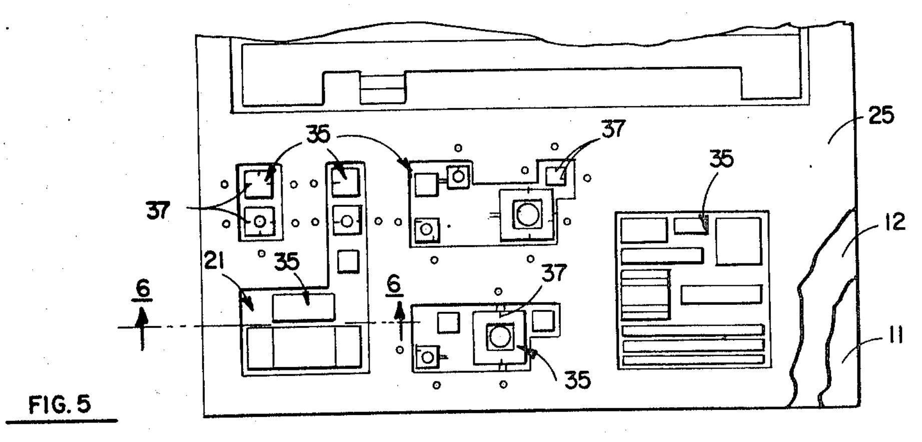
FIG. 5 is a top plan view illustrating the mounting of the components in the assembly of the invention.

Referring now to FIGS. 5 and 6, the various components 35, which may comprise integrated circuit chips or dice or other types of components, are placed in the various cavities 20–24, alignment markers 37 on the components being aligned with the markers 30 formed in the alignment plate to precisely position certain of the components. Others of the components are aligned at their corners with alignment markers 18 formed in conductive layer 12. When the components are properly aligned in position they are bonded to conductive layer 12.

As already noted, components 35 extend approximately 3/4 of their thickness above the surface of alignment plate 25. It is also to be noted that certain of the components, for example, those mounted in alignment plate cavities 22 and 23, have separate ground and heat sink portions 15 and 16 (see FIG. 1), thus enabling terminal and electrical isolation for the components involved.

Figure 7:
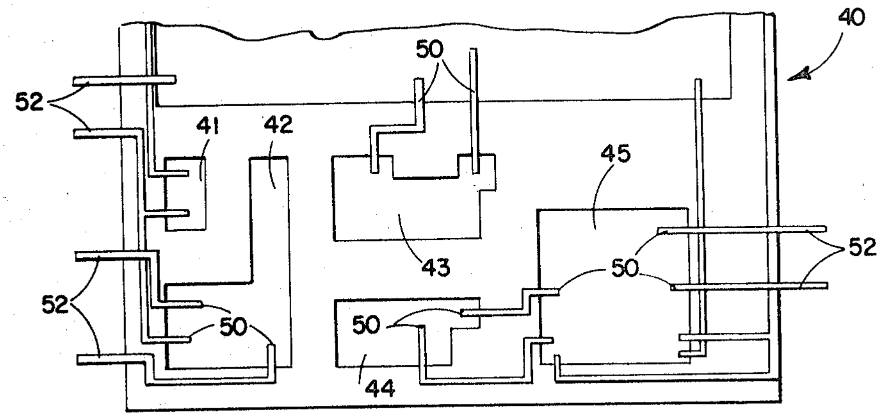
FIG. 7 is a top plan view illustrating an etched circuit board which may be utilized in the assembly of the invention.
Figure 8:
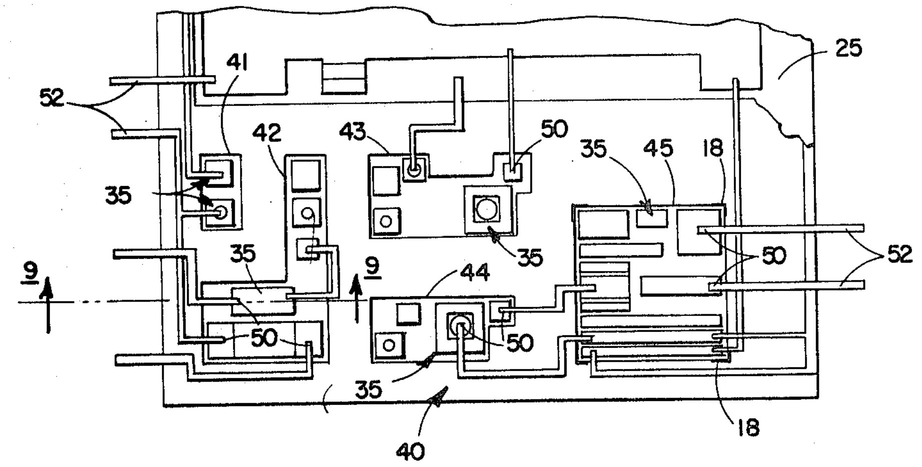
FIG. 8 is a top plan view illustrating the etched circuig board of FIG. 7 as incorporated into the end assembly.

Referring now to FIG. 7, an etched circuit board 40 is fabricated by conventional techniques with the various holes and component cavities being formed by photo-etching, this etched circuit board having cavities 41–45 formed therein which correspond to cavities 20–24 in alignment plate 25, respectively. Etched circuit board 40 also has beam leads 50 integrally formed with the circuitry thereof, these beam leads extending into the cavities. The circuit board further includes beam leads 52 which extend over the edges thereof. The beam leads 52 are utilized for making external connections from the completed assembly while the beam leads 50 are utilized to connect the circuitry of etched circuit board 40 to the components mounted in the cavities as now to be described.

Prior to the placement of etched circuit board 40 in position over alignment plate 25, the various components mounted in the alignment plate cavities are visually inspected and electrically tested as necessary for any possible defects, and any defective components replaced at this time.

After the components have been so checked, etched circuit board 40 is placed in its aligned position over alignment plate 25. The beam leads 50, which are properly aligned with the component terminals to which they are to be connected, are formed so that they make good electrical contact with these terminals but are not permanently attached thereto at this time. The external beam leads 52 are then connected to a test carrier and an electrical test then made of the assembled unit. Any components found to be at fault are replaced at this time, prior to the making of permanent connections, and the unit retested to make sure that everything is functioning normally. Circuit board 40 is then bonded in place to alignment plate 25. Finally, beam leads 50 are permanently bonded to their associated component terminals by conventional techniques such as ultrasonic bonding, welding, laser bonding, etc.

Typically, completely assembled units of this invention might have dimensions about one inch square, with dielectric substrate 11 having a thickness of about 12 mils, alignment plate 25 a thickness of about 2 mils, the components 35 having a thickness of about 9 mils, and etched circuit board 40 a thickness of about 8 mils. These dimensions are given only for illustrative purposes and it should be appreciated that the technique can be utilized in fabricating assemblies of a great variety of dimensions, shapes and form factors.

This invention thus provides a circuit board assembly and a technique for its fabrication which makes for easier assembly and a more reliable end product.

While the invention has been described and illustrated in detail, it is to be clearly understood that this is intended by way of illustration and example only, and is not to be taken by way of limitation, the spirit and scope of this invention being limited only by the terms of the following claims.

We claim:

1. A method for fabricating an interconnected electrical circuit board assembly comprising the steps of:

forming a conductive heat sink and ground layer on a dielectric substrate, forming an alignment plate over said conductive layer, said alignment plate being of a dielectric material and having cavities formed therein in a predetermined pattern for receiving components of said assembly, placing the components in said cavities in predetermined aligned positions, bonding said components to said conductive layer, forming an etched circuit board with cavities therein corresponding to the cavities in said alignment plate, said etched circuit board having beam leads extending into said cavities, placing said etched circuit board over said alignment plate with the cavities thereof aligned with the cavities of said alignment plate, bending said beam leads so that they make electrical contact with corresponding terminals of said components, testing the operation of the assembly, and bonding said beam leads to the component terminals and said etched circuit board to the alignment plate.

2. The method of claim 1 and further including the step of forming alignment apertures in said alignment plate at the same time the cavities are formed therein, said alignment apertures being utilized for aligning the components in said cavities.

3. The method of claim 1 and further including the step of forming separate conductive lands in said conductive layer prior to the forming of the alignment plate thereover.

4. The method of claim 1 and further including the step of electrically and physically checking the components before they are bonded to the conductive layer.

5. The method of claim 1 and further including the step of forming beam leads which extend over the outer edges of said etched circuit board for use in making external connections to the assembly.

6. An electrical circuit board assembly comprising:
- a substrate plate of dielectric material,
- a conductive layer on said substrate plate, said conductive layer having isolated land portions formed therein, said conductive layer serving to provide heat sinks and grounds for said assembly,
- an alignment plate on said conductive layer, said alignment plate being of a dielectric material and having a plurality of cavities formed therein, said alignment further having apertures formed along the sides of said cavities to provide alignment markers,
- components placed within said cavities in alignment with said markers, said components being bonded to the conductive layer, and
- an etched circuit board having cavities formed therein corresponding to the cavities in said alignment plate, said etched circuit board further having beam leads which extend into said cavities to provide interconnections between said etched circuit board and said components, said etched circuit board being bonded to said alignment plate, the cavities of said circuit board being in alignment with the corresponding cavities of said alignment plate and the beam leads thereof being connected to the components.

7. The electrical circuit board assembly of claim 6 wherein said etched circuit board further includes beam leads extending over the outer edges thereof for use in making external connections to said assembly.

* * * * *